US006708405B2

(12) United States Patent
Hasler et al.

(10) Patent No.: US 6,708,405 B2
(45) Date of Patent: Mar. 23, 2004

(54) METHOD FOR PRODUCING AN ELECTRICALLY CONDUCTING CONNECTION

(75) Inventors: Barbara Hasler, Stockdorf (DE); Rainer Florian Schnabel, Höhenkirchen (DE); Guenther Schindler, München (DE); Volker Weinrich, Paris (FR)

(73) Assignee: Infineon Technologies AG, Munich (DE)

( * ) Notice: Subject to any disclaimer, the term of this patent is extended or adjusted under 35 U.S.C. 154(b) by 55 days.

(21) Appl. No.: 09/941,955

(22) Filed: Aug. 28, 2001

(65) Prior Publication Data

US 2002/0032962 A1 Mar. 21, 2002

(30) Foreign Application Priority Data

Aug. 28, 2000 (DE) .......................... 100 42 235

(51) Int. Cl.[7] ................................. H01K 3/10
(52) U.S. Cl. .................... 29/852; 29/847; 216/18; 438/634; 438/643; 438/744
(58) Field of Search .................. 29/842, 844, 846, 29/847, 851, 852; 216/18; 438/618, 633, 634, 638, 643, 647, 744

(56) References Cited

U.S. PATENT DOCUMENTS 5,502,006 A * 3/1996 Kasagi .................. 438/624
5,622,883 A    4/1997 Kim ..................... 438/396
5,668,041 A    9/1997 Okudaira et al. ........... 438/240
5,821,141 A   10/1998 Huang ...................... 438/253
5,879,985 A *  3/1999 Gambino et al. ........... 438/253
5,952,687 A *  9/1999 Kawakubo et al. ......... 257/296
6,107,136 A    8/2000 Melnick et al. ........... 438/253
6,165,833 A * 12/2000 Parekh et al. ............. 438/240
6,309,977 B1 * 10/2001 Ting et al. ................ 438/706

FOREIGN PATENT DOCUMENTS

| DE | 199 04 781 A1 | 8/1999 |
| DE | 198 23 223 A1 | 12/1999 |
| JP | 10 308 446 | 11/1998 |
| WO | 00/14796 | 3/2000 |

* cited by examiner

Primary Examiner—Peter Vo
Assistant Examiner—Donghai D. Nguyen
(74) Attorney, Agent, or Firm—Laurence A. Greenberg; Werner H. Stemer; Ralph E. Locher

(57) ABSTRACT

A method is described for producing a conducting connection through insulating layers by way of a contact hole and conducting materials with which the contact hole is filled. The method permits the production of a contact hole resembling the shape of a wineglass, into which conducting filling material and barrier layers can be inserted without the known problems such as void formation, overetching trenches, and dielectric close-off. It is possible in this way, for example, to produce an electric connection between the diffusion zone of a selection transistor and the lower electrode of a storage capacitor of large-scale integrated DRAM and FeRAM components with the aid of only a few mask steps.

23 Claims, 9 Drawing Sheets

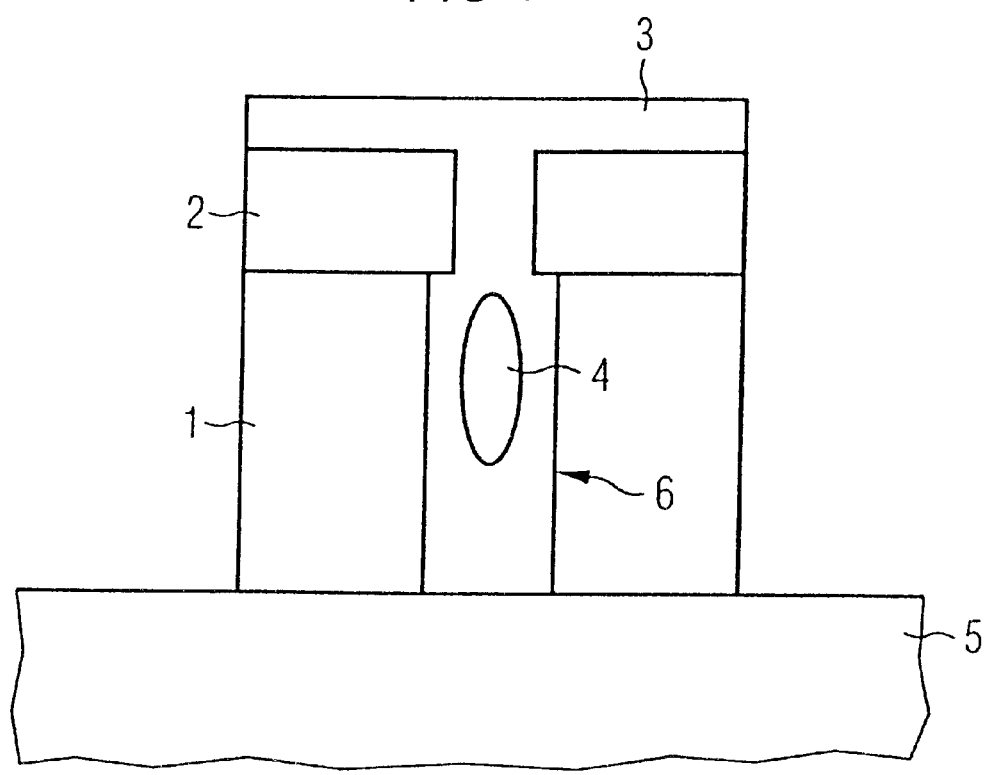

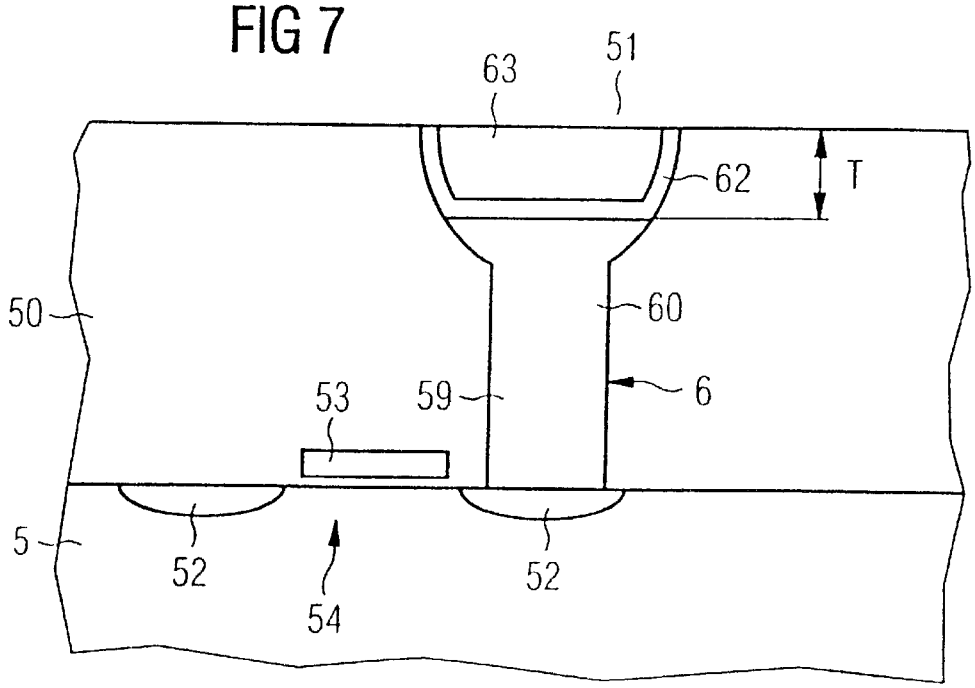
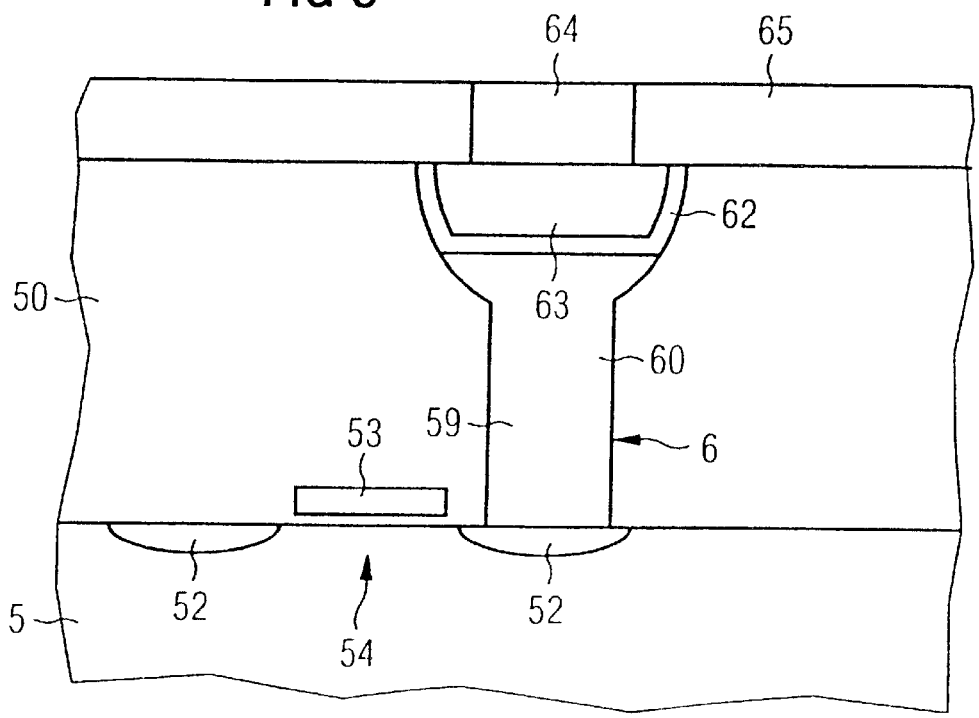

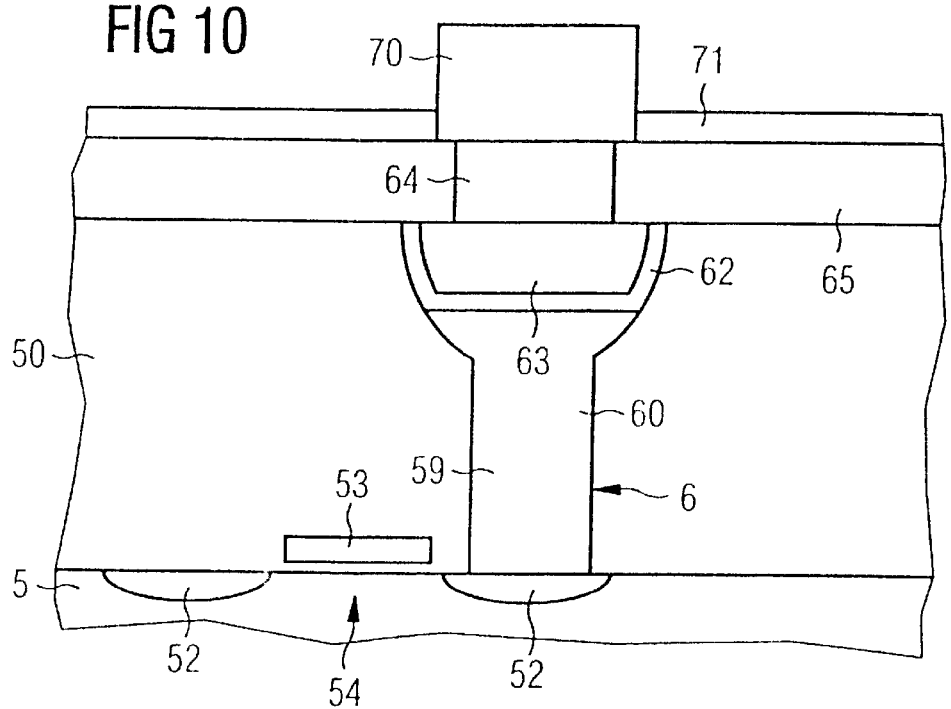
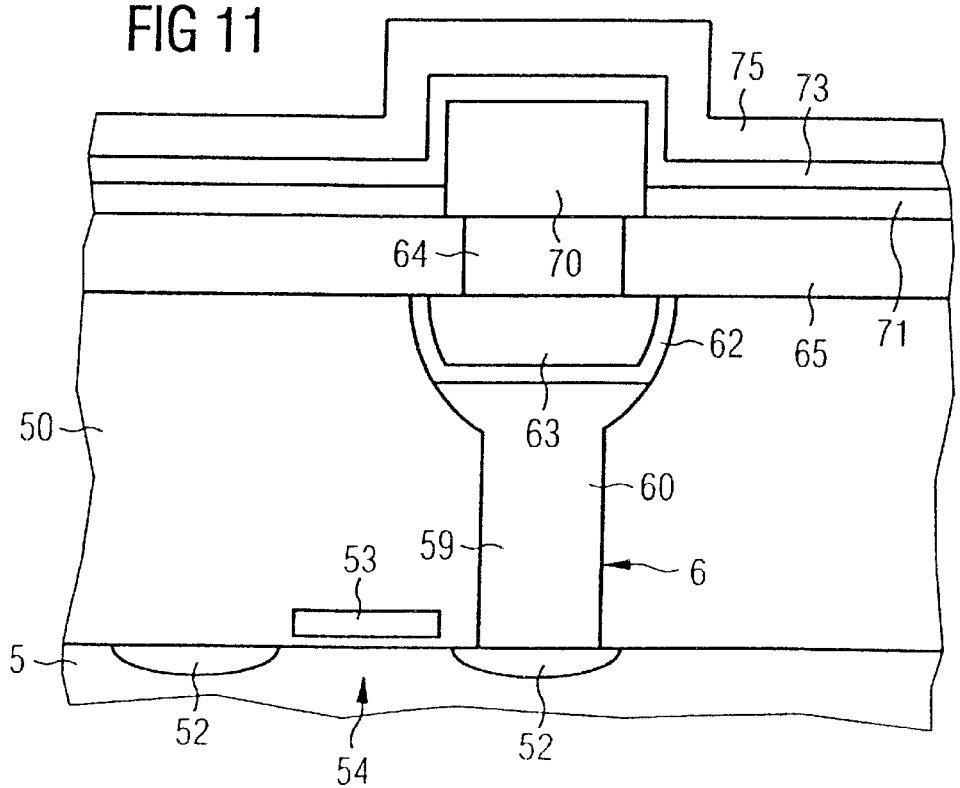

METHOD FOR PRODUCING AN ELECTRICALLY CONDUCTING CONNECTION

BACKGROUND OF THE INVENTION

Field of the Invention

The invention relates to a method for producing electrically conducting connections through one or more insulating layers such as, for example, can be used to connect storage capacitors to the selection transistors in highly integrated FRAMs and DRAMs.

In highly-integrated assemblies, electrically conducting connections and/or contacts generally serve to permit a flow of electric current between electrically conducting sections which are located in different pattern levels. In accordance with the material of the upper and lower conducting pattern levels, there are, for example, silicon/silicon contacts, metal/silicon contacts or metal/metal contacts.

A damascene process is frequently applied to produce such contacts. For this purpose, a contact hole is etched with the aid of a photolithographic step through one (or more) insulating layer(s) down to a connection situated therebelow. This is followed by coating with a conducting material, mostly doped polysilicon, which fills up the etched contact hole completely. Subsequently, the conducting layer is removed as far as down to the insulating layer with the aid of a CMP step (Chemical-Mechanical Polishing) such that only a conducting filling (plug) remains in the etched hole. The plug in this way makes a conducting connection from the top side of the insulating layer to the underside of the insulating layer.

For some contacts such as, for example, for contacts made from polysilicon, which connect a noble metal electrode of a storage capacitor to the diffusion zone of a selection transistor, however, there is still a need for one or more additional conducting layers which are intended to prevent, for example, the diffusion of oxygen atoms or metal atoms into or through the contact. Typical barrier layers are, for example, iridium or iridium oxide. As a rule, the polysilicon is removed by an etching step from an upper part of the contact hole in order to produce the barrier. Subsequently, barrier material is deposited and patterned by means of a CMP step such that the barrier material remains only in the upper part of the contact hole. The barrier material is preferably deposited in this case by a sputtering method.

Unfortunately, the problem arises with this mode of procedure that filling up the contact hole with the barrier material becomes ever more difficult because of the ever smaller diameter of the contact holes. The result of this is either that it is necessary to have recourse to other, more expensive deposition methods, for example CVD methods, or that it is necessary to use an additional phototechnique to produce a depression with a larger diameter overlapping the contact hole. Both alternatives are attended by increased production costs, however.

In the case of some assemblies, for example FeRAMs, two barrier layers are generally used between the polysilicon and the lower electrode layer of the storage capacitor. The first barrier layer covers the polysilicon of the contact and generally prevents the diffusion of silicon atoms through the barrier. The second barrier layer covers the first barrier layer and generally prevents the diffusion of oxygen through the barrier. In some circumstances, a liner layer is still necessary between the polysilicon and first barrier layer, which makes an effectively conducting bonding connection between the polysilicon and first barrier layer. It frequently happens, furthermore, that the insulating layer consists of at least two silicon oxide layers, which have a different etching behavior.

If, in this regard, an electrically conducting connection is made from the lower electrode of a storage capacitor to a selection transistor, a range of further problems arise.

Void formation: because of the different etching rates of the two insulating layers, during etching of the contact hole, and/or during wet cleaning steps before filling up with the conducting filling material, a step is produced in the contact hole along the contact area of the two insulating layers. In the case of small contact hole diameters, during the subsequent coating process with the conducting filling material this step easily leads to incomplete filling which can lead to void formation, as is shown in FIG. 1. In FIG. 1, the lower insulating layer 1 on the semiconductor substrate 5 consists of a BPSG silicon oxide, while the upper insulating layer 2 consists of a silicon oxide produced using the TEOS process. An etching step or a wet cleaning step before the filling of the contact hole 6 produces a step in the contact hole 6 at the boundary layer between the two oxide layers. The conducting filling layer 3 consists of polysilicon. The void 4 is produced during coating with the polysilicon by virtue of the fact that the opening of the upper oxide layer is sealed before complete filling because of the smaller diameter.

Overetching trenches: in order to apply the second barrier layer to the first barrier layer in the contact hole region with the aid of the damascene method, it is necessary to structure on the substrate a mask which must have a corresponding opening at the feed-through. Because of a lack of control options, for example, instances of overetching can easily occur as the mask is being etched in this process, such that etching proceeds laterally past the first barrier layer, resulting in the formation of a trench next to the first barrier layer. This overetching trench can, for example, cause the second barrier layer, which is still to be applied, at the edge to come into contact in the opening with the liner or with the polysilicon such that oxidation of the polysilicon or other undesired chemical reactions occur which can lead to contact problems. FIG. 2a and FIG. 2b show two conditions under which overetching trenches can be produced in an insulating layer 10: in FIG. 2a, the mask opening is larger than the surface of the first barrier layer 11 and adhesion-promoting layer 12, such that an overetching trench 15 is formed around the first barrier layer 11 and the adhesion-promoting layer 12. A following second barrier layer would fill the overetching trench 15 and come into contact with the liner. In FIG. 2b, an overetching trench 15 is produced laterally by a misalignment of the mask opening with reference to the surface of the first barrier layer 11 and the adhesion-promoting layer 12. A second barrier layer would fill the overetching trench and, in this example, come into contact with the liner 12 and the polysilicon filling 13.

Dielectric close-off: for a good and effectively conducting adhesive contact on the polysilicon layer, the first barrier layer usually requires an adhesion-promoting layer, preferably a liner, as interlayer. However, the liner can react chemically upon contact with the second barrier layer, and this can lead to a dielectric close-off. The liner should therefore also not be in contact with the lower electrode or the capacitor dielectric. During the production of the barrier layers, it must therefore be ensured that the liner and second barrier layer do not come into contact. FIG. 3 and FIG. 4 show two variants of a conducting connection through an insulating layer 10 on a semiconductor substrate 5 according to the prior art, in the case of which the undesired contacts between the adhesion-promoting layer 12 and second barrier layer 17 occur. In FIG. 3, a platinum layer 18 is applied to the second barrier layer 17, which rests, in turn, on a first barrier layer 11, an adhesion-promoting layer 12 and a polysilicon layer 13. The critical transition points between second barrier layer 17 and adhesion-promoting layer 12 are situated at the edge of the adhesion-promoting layer. The problem in FIG. 4 scarcely differs.

SUMMARY OF THE INVENTION

It is accordingly an object of the invention to provide a method of producing an electrically conductive connection, which overcomes the above-mentioned disadvantages of the heretofore-known devices and methods of this general type and which lessens or avoids the above-described difficulties entirely, and in so doing permits the number of process steps to be kept as low as possible or even to be reduced.

With the foregoing and other objects in view there is provided, in accordance with the invention, a method of producing an electrically conducting connection through insulating layers. The novel method comprises the following method steps:

providing a semiconductor substrate with at least one insulating layer;

applying a mask to a surface of the insulating layer;

carrying out a substantially isotropic etching step;

carrying out a substantially anisotropic etching step until an underside of the insulating layers is reached and a contact hole is produced;

removing the mask;

filling the contact hole with a first conducting material;

etching back the first conducting material down to a prescribed depth; and filling a free region of the contact hole with at least one second conducting material.

The invention is particularly suitable for producing an electrically conducting connection between a diffusion zone and an electrode.

The method according to the invention has the advantage that it is possible with the aid of only one mask step to obtain a shape of contact hole resembling a wineglass and substantially approximates the requirement for a contact hole with a small contact hole area in the anisotropically etched region and a larger contact hole area in the isotropically etched region. Owing to the larger upper opening, this shape of contact hole facilitates complete filling both with the first and with the second conducting material. In particular, owing to the larger diameter sputtering methods can be used in the upper region to deposit the second conducting material.

Furthermore, this shape of contact hole permits a conducting connection of a very small contact on the underside of the insulating layers, for example a diffusion zone of a selection transistor, to a pattern on the upper side of the insulating layers, which can occupy somewhat more lateral space such as, for example, a lower electrode of a storage capacitor.

The larger opening of the contact hole in the upper region further makes it possible, for the purpose of etching a mask to be patterned on the contact hole, for example in order to apply a further conducting material to the second conducting material, for the second conducting material to serve as etching stop so as to preclude the overetching trenches described and their associated problems.

With standard methods, at least two mask steps are required to obtain a contact hole with a small contact hole area in the anisotropically etched region and a large contact hole area in the isotropically etched region. By contrast, one mask step produces the shape of contact hole resembling a wineglass, which functionally has the same advantages as the shape of contact hole produced in the two-mask process. One mask step saved economizes on several further process steps, and this leads to a higher yield in the production of non-defective chips, and thereby helps to lower the costs.

In accordance with an added feature of the invention, the ratio of the contact hole area in the isotropically etched region to the contact hole area in the anisotropically etched region is between 1.5 and 4, preferably between 2 and 3. Furthermore, it is preferred when the first conducting material is etched back at most as far as the anisotropically etched region of the contact hole. This avoids the need for the second conducting material to be deposited in the narrower anisotropically etched region of the contact hole.

An adhesion-promoting layer, in particular titanium, titanium nitride, titanium silicide, tantalum nitride or tantalum silicon nitride, is preferably produced between the first conducting material and the second conducting material. It is particularly preferred in this case when the patterning of the adhesion-promoting layer and of the second conducting material is performed by a common single-stage or multistage CMP step.

In accordance with an additional feature of the invention, a third conducting material is applied to the second conducting material. In accordance with an embodiment of the present invention, in this case the second conducting material is used as landing pad for the third conducting material. In this way, the adhesion-promoting layer is protected by the second conducting material against direct contact with the third conducting material. It is particularly preferred in this regard when the third conducting material is patterned with the aid of a CMP method.

In accordance with a further embodiment of the present invention, the contact hole is not yet filled up completely by the second conducting material, with the result that the third conducting material can be deposited into the as yet free region of the contact hole. It is once again possible in this way to save a mask level, which would otherwise be necessary to pattern the third conducting material. Furthermore, in this configuration there is also no direct contact between the adhesion-promoting layer and the third conducting material.

It is particularly preferred here when the patterning of the second and of the third conducting material (and, if appropriate, of the adhesion-promoting layer) is performed by a common single-stage or multistage CMP step. It can be advantageous in this case when the CMP process for the third conducting material is selective in relation to the second conducting material. In this way, the two materials can be removed separately from one another in a controlled fashion by the polishing liquid.

In accordance with a further feature of the invention, doped polysilicon is used as first conducting material. It is preferred, furthermore, when a barrier material is used as second and/or third conducting material. It is particularly preferred here when a barrier material for suppressing the diffusion of silicon atoms, in particular iridium, is used as second conducting material. It is preferred, furthermore, when a barrier material for suppressing the diffusion of oxygen atoms, in particular iridium oxide, is used as third conducting material. It is possible in this way, for example, to produce the conducting connections between the selection transistors and the storage capacitors in the ferroelectric memory cells. Consequently, the lower electrode layer of a ferroelectric capacitor can be applied to the third conducting material.

In accordance with a preferred embodiment of the present invention, an etching stop layer, in particular a silicon nitride layer, is applied before the production of an electrode, the etching stop layer being opened before the application of the electrode layer at the later support point of the electrode. The lower electrode of the storage capacitor can be patterned, for example, by a damascene method. During the following removal of material, the etching stop layer protects an oxide layer used during the damascene method against overetching trenches. This oxide layer is preferably removed again subsequently in order also to have available the side walls of the lower electrode as a capacitance-providing surface for storing charge.

It can occur owing to the process that the insulating layer consists of a lower insulating layer, an upper insulating layer and, possibly, further insulating layers therebetween. It is advantageous in this case when the isotropic etching reaches down into the lower insulating layer. Since, in this way, possible contact hole steps are situated in the wide, isotropically etched contact hole region, the formation of voids can be reliably prevented during deposition of the first conducting material.

Other features which are considered as characteristic for the invention are set forth in the appended claims.

Although the invention is illustrated and described herein as embodied in method for producing an electrically conducting connection, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1, 2A, 2B, 3, and 4 are partial sectional views showing various conducting connections through one or more insulating layers, according to the prior art;

FIGS. 5–11 are partial sectional views illustrating the method according to the invention for producing an electrically conducting connection of a semiconductor substrate through an insulating layer to a storage capacitor, the contact hole containing only one barrier layer.

DESCRIPTION OF THE PREFERRED EMBODIMENTS

Figure 5:
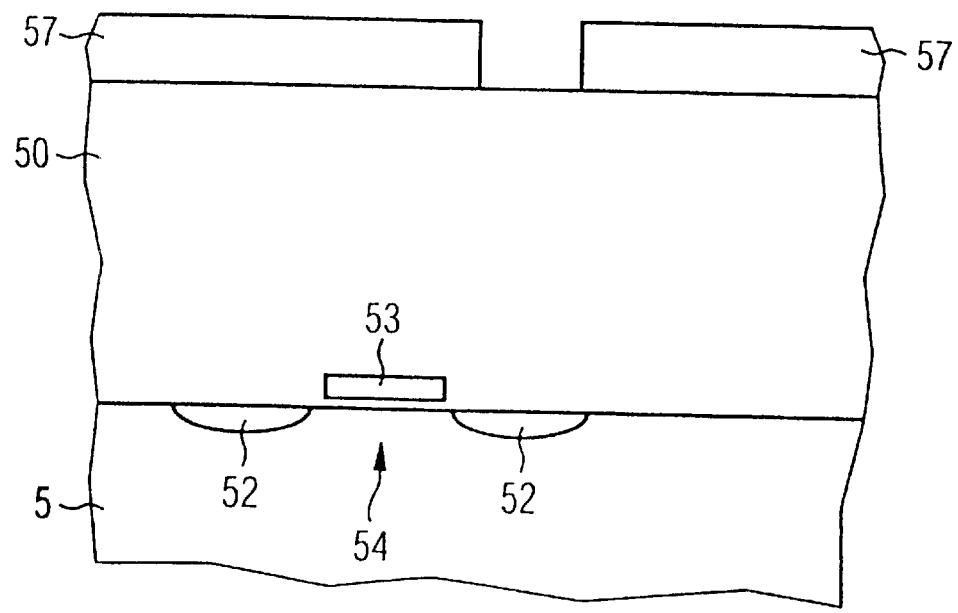

FIG. 5 shows a semiconductor substrate 5 with a selection transistor 54 on the surface, which comprises two diffusion zones 52 and a gate 53. An insulating layer 50 is applied to the semiconductor substrate surface. In the exemplary embodiment, the insulating layer 50 is a silicon oxide, preferably a BPSG oxide or a silicon oxide from a TEOS process. Furthermore, a mask 57 whose openings define positions of the contact holes to be produced is applied to the insulating layer.

Figure 6:
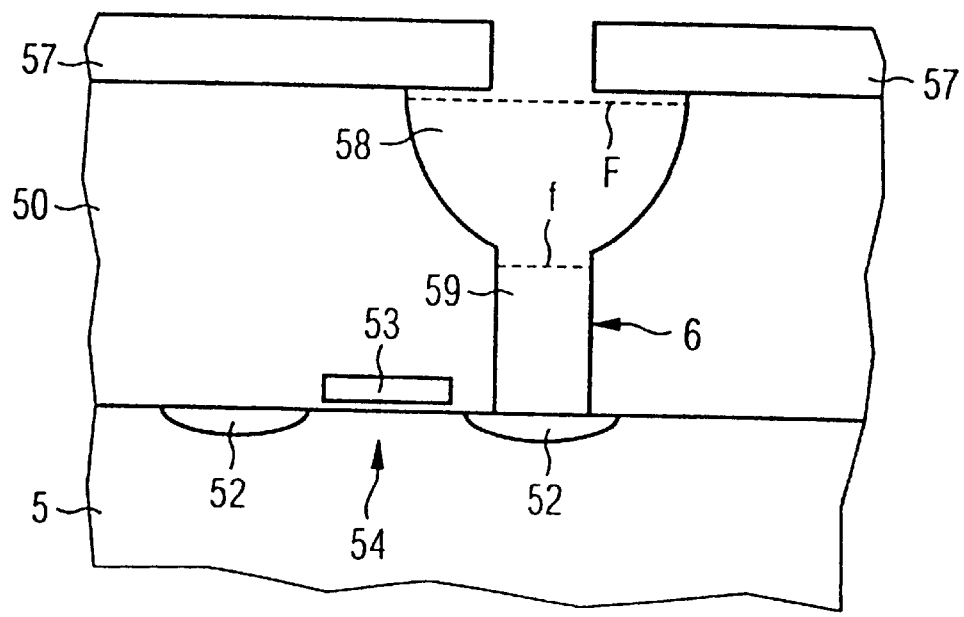

FIG. 6 shows the same pattern, after the isotropic and, subsequently, the anisotropic etching have been carried out. In the exemplary embodiment, it is possible to recognize the contact hole resembling a wineglass, which is obtained when the mask opening is substantially circular. The "cup" of the wineglass is obtained by the isotropic etching 58, while the "stem" of the wineglass was obtained by the anisotropic etching 59. The diameter of the stem is given substantially by the diameter of the mask opening. It may be stressed that this advantageous shape of the contact hole has been achieved with only one mask step. Here, in the present example the ratio of the contact hole area f at the surface in the isotropically etched region to the contact hole area f in the anisotropically etched region is approximately 2.5.

FIG. 7 shows the pattern after the mask 57 has been removed and cleaned by means of an HF dip and the contact hole 6 has been filled with conducting material. The filling was carried out in the exemplary embodiment by means of the following steps: polysilicon is applied in a CVD process to the insulating layer 50 provided with the contact hole 6, and subsequently removed again by etching or polishing down to the surface of the insulating layer 50. Some of the polysilicon remaining in the contact hole is further etched off from the top down to a prescribed depth so as to produce a polysilicon layer 60 (first conducting material). The surface of the polysilicon layer 60 is preferably situated in the isotropically etched region.

Subsequently, in the exemplary embodiment a thin adhesion-promoting layer 62, preferably titanium, titanium nitride, titanium silicide, tantalum nitride or tantalum silicon nitride, and thereafter a thick first barrier layer 63, preferably made from iridium which completely fills up the contact hole, are applied using conventional methods, and are removed, preferably in a common CMP step down to the surface of the insulating layer 50. The first barrier layer 63 represents the second conducting material here. The contact hole 6 is now filled, the contact hole area being provided in the isotropically etched region 51 substantially by the surface of the first barrier layer 63.

Figure 2A:
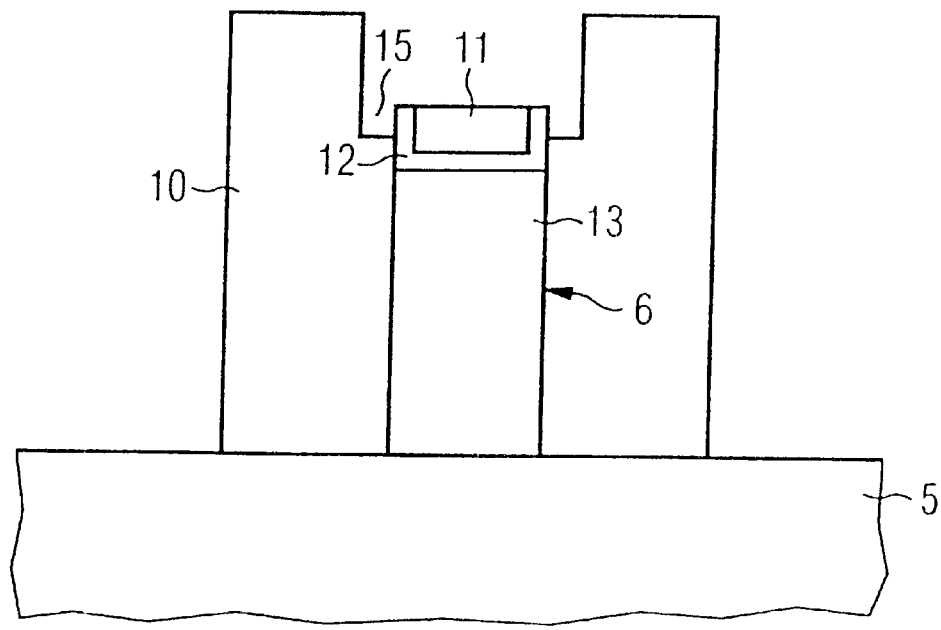
Figure 2B:
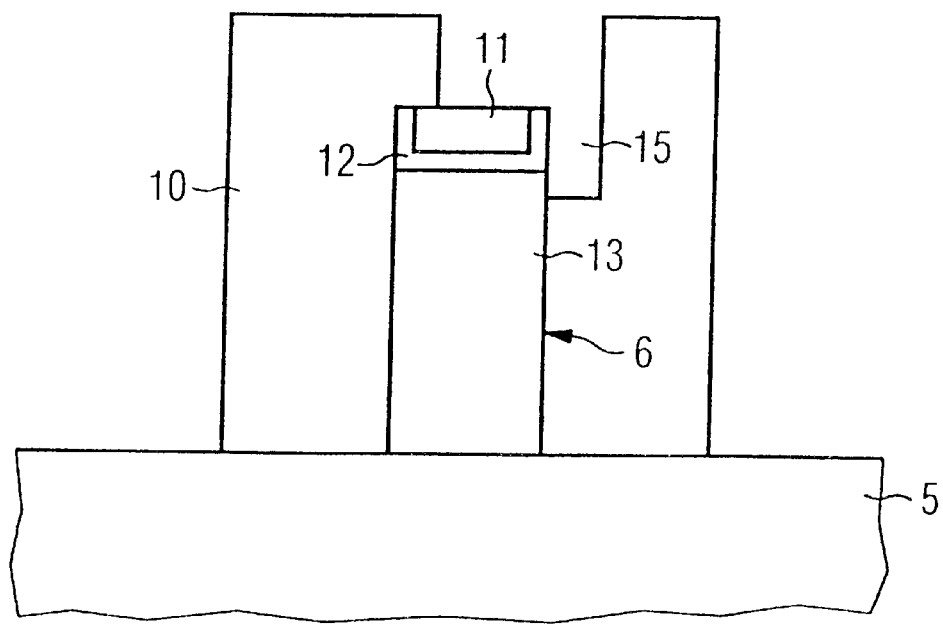
Figure 3:
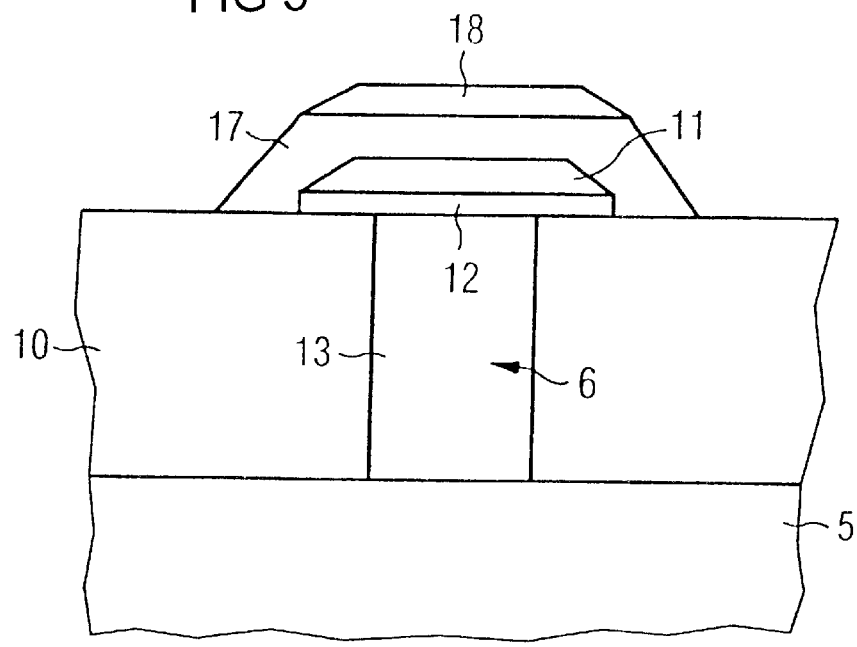
Figure 4:
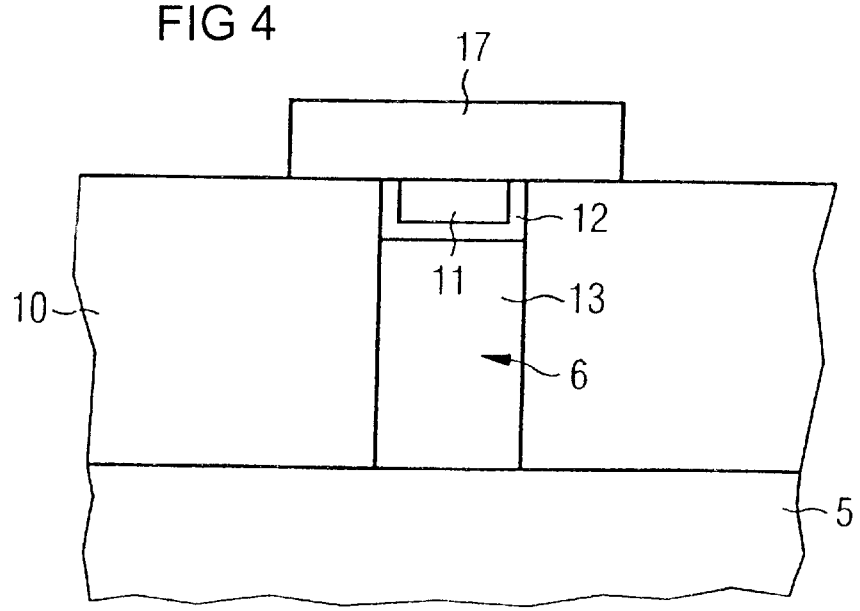

FIG. 8 shows the next steps. A mask layer 65 made from, for example, silicon oxide is applied and structured using conventional methods such that the mask openings coincide with the contact holes. The mask openings are selected to be so small here that they are completely covered by the surface of the first barrier layer 63. During etching of the holes, the first barrier layer 63 can thus be used as an etching stop, and this avoids the destructive effects of the overetching trenches shown in FIG. 2.

The application and patterning of the second barrier layer 64 (third conducting material), preferably iridium oxide, at the mask layer 65 with the aid of the damascene method is performed according to the prior art.

Figure 9:
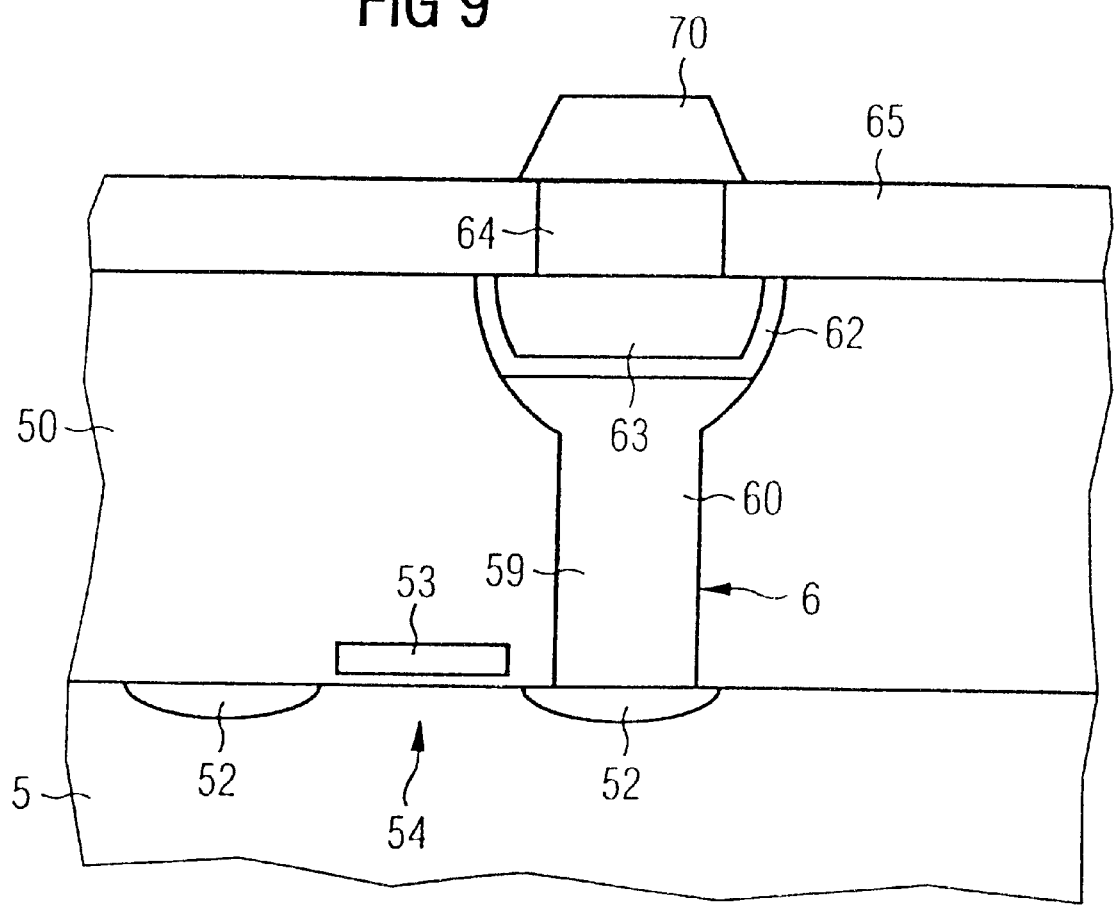

It is now possible in a first design to grow a layer for the lower electrode 70, preferably made from a noble metal or one of its oxides, in particular including platinum, onto the second barrier layer 64. The subsequent patterning of the lower electrode layer 70 can be performed, for example, by means of RIE etching known from the prior art (FIG. 9).

The patterning of the layer for the lower electrode 70 can alternatively be performed with the aid of a further damascene process step, an etching stop layer 71 also being applied below the mask layer in addition to the mask layer required for the purpose (FIG. 10). The etching protection layer is advantageous, since the mask is removed again after the patterning of the lower electrode 70 in order also to be able to cover the side walls of the lower electrode 70 with a dielectric layer. The latter permits a maximum capacitance in conjunction with minimal lateral extent of the storage capacitor to be produced. In the exemplary embodiment, the lower electrode 70 is made from platinum and the etching protection layer 71 from SiN. The steps for producing and patterning the lower electrode correspond to the prior art.

FIG. 11 shows the concluding steps in the design according to the invention for producing the storage capacitors on the contact hole: firstly, a thin dielectric layer 73 is applied to the lower electrode 70 and its surroundings, followed by the upper electrode layer 75. In the exemplary embodiment, the dielectric layer 73 is made from SBT, and the upper electrode layer 75 from platinum.

A further exemplary embodiment according to the invention is shown in FIGS. 12 to 15. By contrast with the previous design according to the invention, instead of one insulating layer this design has a lower insulating layer 100 and an upper insulating layer 102. Furthermore, first, second and third conducting material is accommodated in the contact hole together with an adhesion-promoting layer, thus saving at least one mask step.

Figure 12:
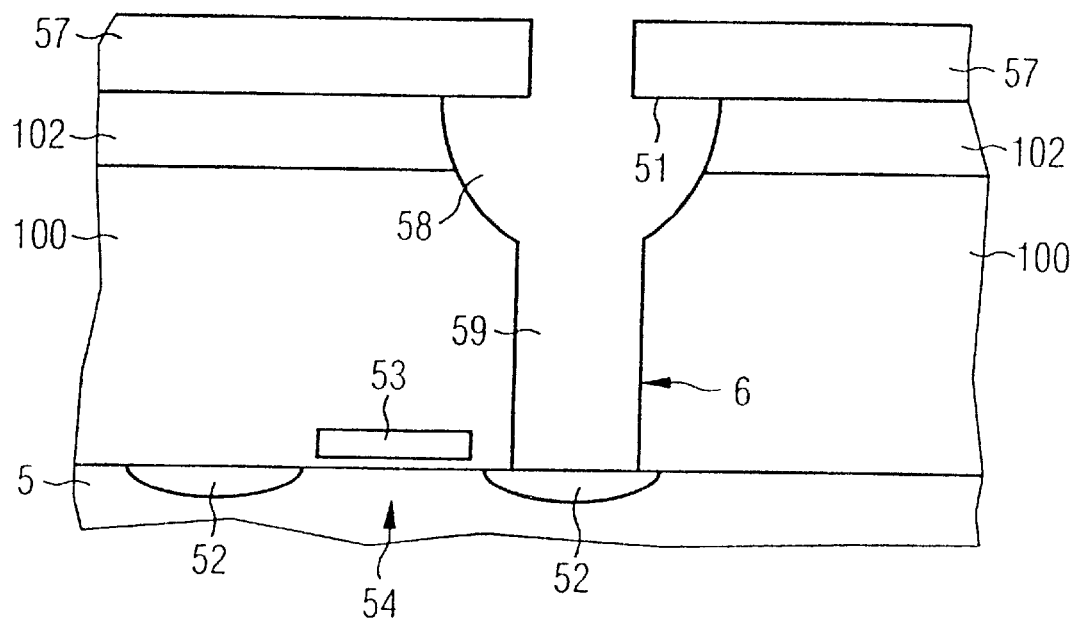
FIGS. 12–15 are similar sectional views illustrating a further method according to the invention for producing an electrically conducting connection from a semiconductor substrate through two insulating layers to a storage capacitor, the contact hole containing two barrier layers.

FIG. 12 shows the semiconductor substrate 5 with applied lower insulating layer 100, upper insulating layer 102 and the mask 57 after firstly an isotropic and then an anisotropic etching have been carried out at a substantially round mask opening from the top insulating layer 102 down to the diffusion zone 52. As in FIG. 6, this etching sequence leads to a contact hole 6 of wineglass type with an isotropic etched hole region 58 and an anisotropic etched hole region 59. FIG. 12 differs from FIG. 6 only by the presence of two insulating layers. The lower insulating layer is preferably a BPSG oxide, and the upper insulating layer is preferably a silicon oxide applied using the TEOS method. In the preferred design, the isotropic etching is carried out down into the lower insulating layer so that possible contact hole steps can form only in the widened contact hole region, not in the narrow anisotropically etched region. The etching rate of the two oxides with reference to the etching means is substantially the same in this design, and so no etched step is formed in the contact hole 6 in the transition region between the lower insulating layer 100 and upper insulating layer 102.

Figure 13:
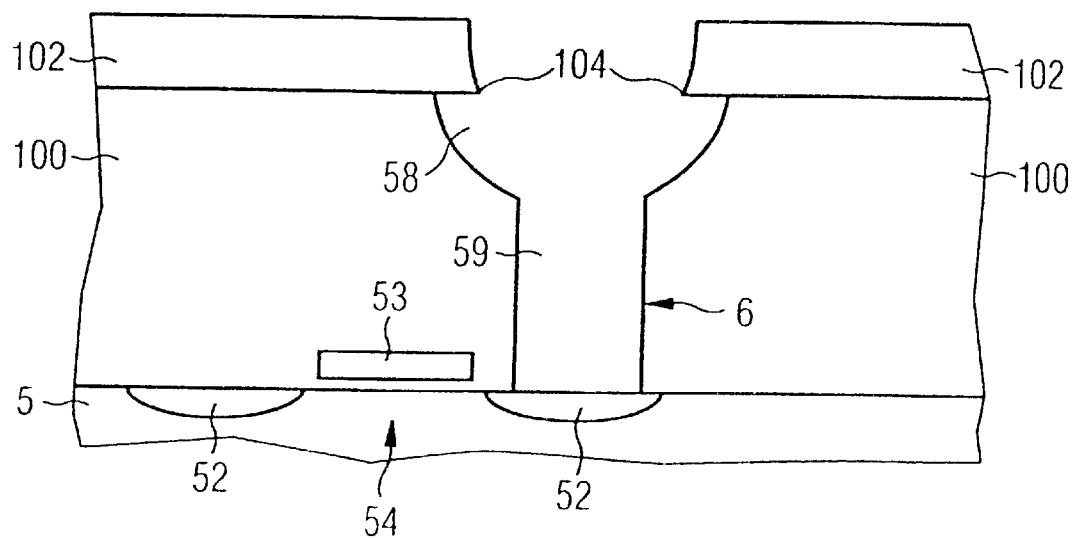

FIG. 13 shows the semiconductor substrate 5 after the mask 57 has been removed, and the semiconductor substrate 5 has been subjected to an HF dip for cleaning purposes. This cleaning step is usually carried out before the application of the polysilicon layer, but effects a selective etching between the two oxides of the lower insulating layer 100 and upper insulating layer 102. This leads to the contact hole step 104 in the contact hole at the transition from the lower insulating layer 100 to the upper insulating layer 102. However, since the contact hole step 104 is situated in the wide isotropic etched region 58, it presents no problem for the filling, now following, with conducting materials.

Figure 14:
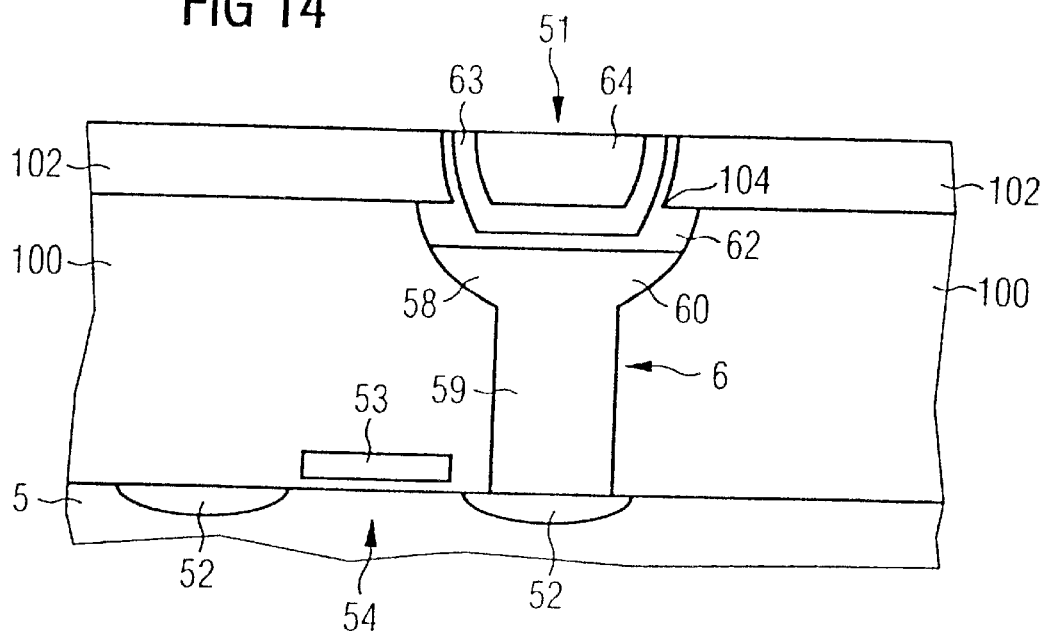

FIG. 14 shows the contact hole 6 after filling with the three conducting layers and the adhesion-promoting layer 62 with the following steps: after the HF dip, a polysilicon layer is applied so as to fill the contact layer 6. Subsequently, the polysilicon layer is removed again down to the surface of the upper insulating layer 102, for example by etching or a CMP step, such that the polysilicon remains only in the contact hole 6. By further etching, the polysilicon is then etched off in the contact hole 6 to the extent that still further conducting layers can be accommodated in the contact hole. In a preferred design, the further etching will go only so far that the surface of the polysilicon layer still remains in the isotropic etched hole region 58. In this way, a polysilicon layer 60 is applied which corresponds to the first conducting material of claim 1.

Subsequently, an adhesion-promoting layer 62, that is to say a liner, preferably titanium, titanium nitride, titanium silicide, tantalum nitride or tantalum silicon nitride, is applied, and then a first barrier layer 63, which corresponds to the second conducting material of claim 1, and a second barrier layer 64, which corresponds to the third conducting material of claim 1, and etched by means of a single-stage, two-stage or multistage CMP step such that all three conducting materials, that is to say the polysilicon layer 60, the first barrier layer 63 and the second barrier layer 64 are accommodated in the contact hole 6 together with the adhesion-promoting layer 62. This method saves the most mask steps and CMP steps for the production of a conducting connection through insulating layers with three conducting materials. Iridium is the preferred material of the first barrier layer 63, and iridium oxide that of the second barrier layer 64.

Alternatively, the application of the conducting materials, including the adhesion-promoting layer 62, to form layers, and the patterning by means of a CMP step can also be carried out individually one after another or in pairs, for example it is possible firstly to apply the adhesion-promoting layer 62 and the first barrier layer 63 and pattern them by means of a CMP step, and only thereafter to apply the second barrier layer 51 and pattern it; however, other sequences are also possible.

Figure 15:
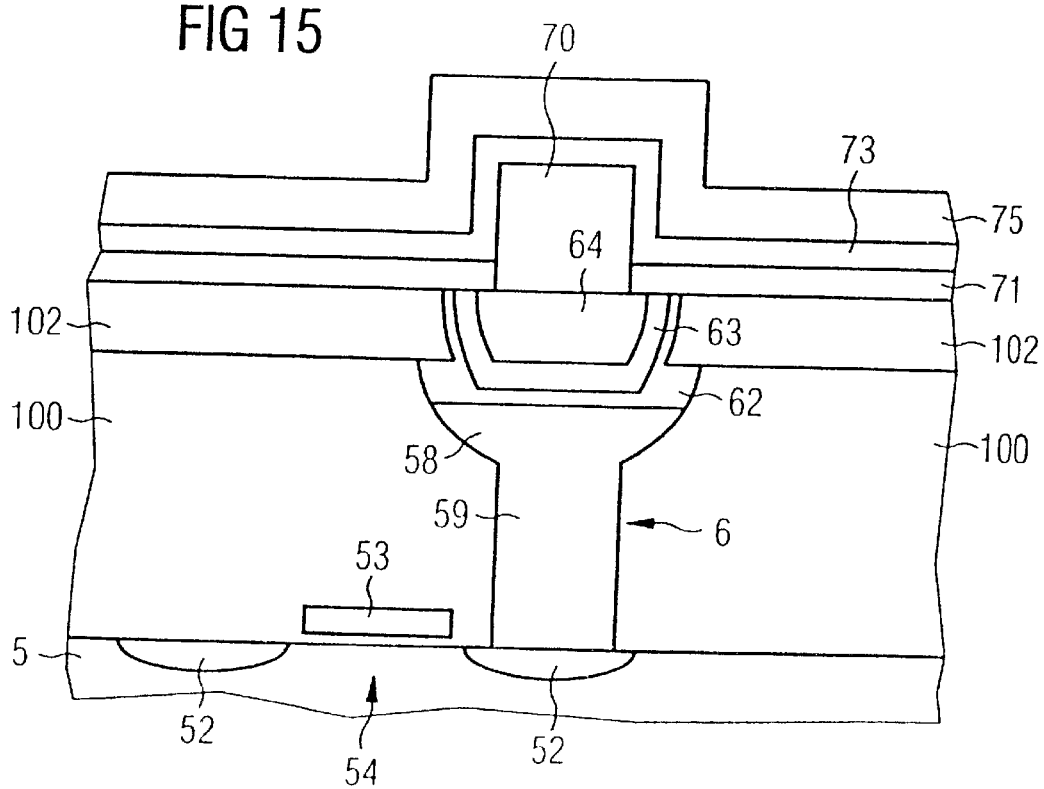

After the contact hole 6 has been filled, in one design a storage capacitor with a lower electrode 70, dielectric layer 73 and upper electrode layer 75 can be applied (FIG. 15). Here, the surface of the second barrier layer 64 serves as landing pad for patterning the mask for the lower electrode 70. The surface of the second barrier layer 64 must therefore completely cover the support surface of the lower electrode 70 in order to prevent overetching trenches. Since the second barrier layer 64 and the dielectric layer 73, which are usually materials having a very high dielectric constant for extra-large-scale integrated storage components, in particular being ferroelectric and/or paraelectric materials, are not chemically compatible, an etching protection layer 71, mostly silicon nitride, is applied to the upper insulating layer 102, which covers the barrier layers 63 and 64 with the exception of the zone which is fitted with the lower electrode.

The etching protection layer 71 and a mask layer, which is preferably produced using the TEOS method, are applied to the upper insulating layer 102 and patterned such that subsequently a layer for the lower electrode 70 can be put onto the mask and patterned on the mask by means of the damascene method. Subsequently, the mask is etched off again so that the edge of the lower electrode also becomes free for the dielectric layer 73 and the upper electrode layer 75 in order to increase the storage capacity. The etching protection layer 71 remains, however. Subsequently, the thinnest possible dielectric layer 73 and, thereafter, the upper electrode layer 75 are put on, and this is performed using methods according to the prior art.

The design permits a storage capacitor pattern with plating through to the substrate to be obtained with a total of seven patterned layers by applying only two damascene method steps. An important constituent of this method is the use of contact holes, which are obtained from an isotropic and an anisotropic etching.

We claim:

1. A method of producing an electrically conducting connection through insulating layers, which comprises the following method steps:

providing a semiconductor substrate with at least one insulating layer;

applying a mask to a surface of the at least one insulating layer;

carrying out a substantially isotropic etching step;

carrying out a substantially anisotropic etching step until an underside of the at least one insulating layer is reached and a contact hole is produced;

removing the mask;

filling the contact hole with a first conducting material;

etching back the first conducting material down to a prescribed depth;

filling a free region of the contact hole with at least one second conducting material;

forming an adhesion-promoting layer between the first conducting material and the second conducting material; and applying a third conducting material to the second conducting material, the third conducting material having barrier material for suppressing the diffusion of oxygen atoms.

2. The method according to claim 1, which comprises producing an electrically conducting connection between a diffusion zone and an electrode.

3. The method according to claim 1, wherein a ratio of a contact hole area in an isotropically etched region to the contact hole area in an anisotropically etched region is between 1.5 and 4.

4. The method according to claim 3, wherein the ratio is between 2 and 3.

5. The method according to claim 1, which comprises etching the first conducting material back at most as far as the anisotropically etched region of the contact hole.

6. The method according to claim 1, which comprises forming an adhesion-promoting layer between the first conducting material and the second conducting material.

7. The method according to claim 6, which comprises forming the adhesion-promoting layer of a material selected from the group consisting of titanium, titanium nitride, titanium silicide, tantalum nitride, and tantalum silicon nitride.

8. The method according to claim 6, which comprises patterning the adhesion-promoting layer and the second conducting material in a single-stage CMP step.

9. The method according to claim 6, which comprises patterning the adhesion-promoting layer and the second conducting material in a multi-stage CMP step.

10. The method according to claim 1, which comprises utilizing the second conducting material as a landing pad for the third conducting material.

11. The method according to claim 10, which comprises patterning the third conducting material with a CMP method.

12. The method according to claim 1, wherein the third conducting material is deposited in a free region of the contact hole.

13. The method according to claim 12, which comprises patterning the second and the third conducting with a single-stage CMP step.

14. The method according to claim 12, which comprises patterning the second and the third conducting material with a multistage CMP step.

15. The method according to claim 1, which comprises depositing doped polysilicon as the first conducting material.

16. The method according to claim 1, which comprises depositing a barrier material as the second and a third conducting material.

17. The method according to claim 1, wherein a barrier material for suppressing a diffusion of silicon atoms is used as the second conducting material.

18. The method according to claim 17, wherein the barrier material for suppressing a diffusion of silicon atoms is iridium.

19. The method according to claim 1, wherein the barrier material for suppressing the diffusion of oxygen atoms is iridium oxide.

20. The method according to claim 1, which comprises applying an etch stop layer and subsequently producing an electrode.

21. The method according to claim 20, wherein the etch stop layer is a silicon nitride layer.

22. The method according to claim 1, which comprises forming the at least one insulation layer of a lower insulating layer and an upper insulating layer, and reaching the isotropic etching down into the lower insulating layer.

23. The method according to claim 1, which comprises patterning a lower electrode using a damascene process.

* * * * *